United States Patent
Hirano et al.

(10) Patent No.: US 7,378,918 B2
(45) Date of Patent: May 27, 2008

(54) TWO-POINT MODULATION TYPE PHASE MODULATION APPARATUS, POLAR MODULATION TRANSMISSION APPARATUS, WIRELESS TRANSMISSION APPARATUS AND WIRELESS COMMUNICATION APPARATUS

(75) Inventors: Shunsuke Hirano, Kanagawa (JP); Hisashi Adachi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 67 days.

(21) Appl. No.: 11/410,293

(22) Filed: Apr. 25, 2006

(65) Prior Publication Data
US 2007/0013447 A1  Jan. 18, 2007

(30) Foreign Application Priority Data
Apr. 27, 2005 (JP) .............................. 2005-129791

(51) Int. Cl.
*H03C 3/00* (2006.01)
*H03L 7/08* (2006.01)
*H03L 7/18* (2006.01)
*H04B 1/04* (2006.01)

(52) U.S. Cl. ..................... 332/144; 332/145; 331/16; 331/17; 331/18; 331/23; 455/110; 455/112; 455/113

(58) Field of Classification Search ........ 332/103–105, 332/144, 145, 149, 151; 331/1 A, 16–18, 331/23, 25; 375/300, 302; 455/108, 110, 455/112, 113, 118
See application file for complete search history.

(56) References Cited

U.S. PATENT DOCUMENTS

| 5,952,895 | A | 9/1999 | McCune, Jr. et al. |
| 6,985,703 | B2 * | 1/2006 | Groe et al. ................. 455/108 |
| 7,010,280 | B1 | 3/2006 | Wilson |
| 2005/0079835 | A1 | 4/2005 | Takabayashi et al. |
| 2006/0052073 | A1 | 3/2006 | Yoshikawa et al. |
| 2006/0197605 | A1 | 9/2006 | Hirano et al. |

FOREIGN PATENT DOCUMENTS

| JP | 2002530992 | 9/2002 |
| JP | 2004356835 | 12/2004 |
| JP | 2005072874 | 3/2005 |
| JP | 2005072875 | 3/2005 |

OTHER PUBLICATIONS

International Search Report dated Jun. 20, 2006.

* cited by examiner

*Primary Examiner*—David Mis
(74) *Attorney, Agent, or Firm*—Dickinson Wright, PLLC

(57) ABSTRACT

There provides a two-point modulation phase modulation apparatus capable of obtaining an RF phase modulation signal of superior modulation precision with low power consumption and a simple configuration even in the event of inputting a wide band baseband modulation signal. A differentiator (21) of the opposite characteristics to the attenuation characteristics of anti-alias filter (22) is provided at the front stage of a D/A converter (6). As a result, it is possible to sufficiently suppress an alias signal without raising the sampling frequency of the D/A converter (6) (i.e. low power consumption) using an anti-alias filter (22) of a simple configuration (i.e. low cost) with a low order for a narrower bandwidth than a PLL modulation frequency bandwidth, and it is possible to obtain an RF phase modulation signal where the entire frequency band of input digital baseband modulation signal (S1) is reflected in a superior manner.

12 Claims, 15 Drawing Sheets

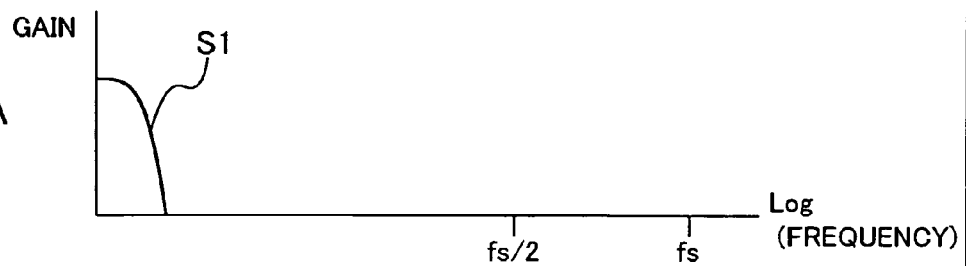
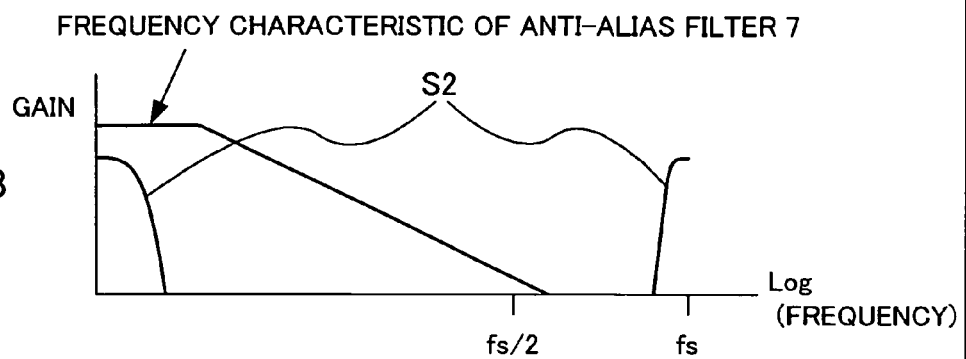
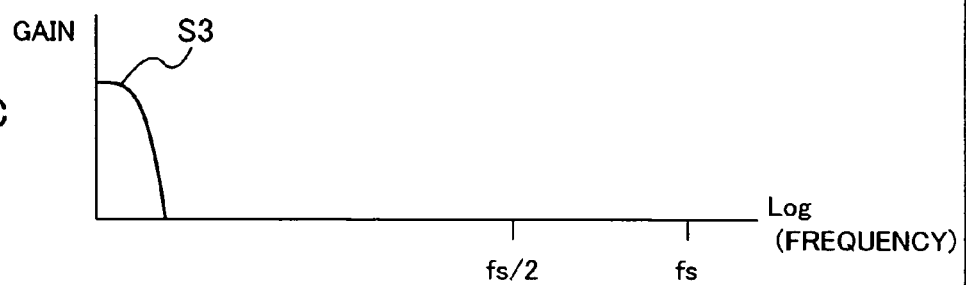
(PRIOR ART)

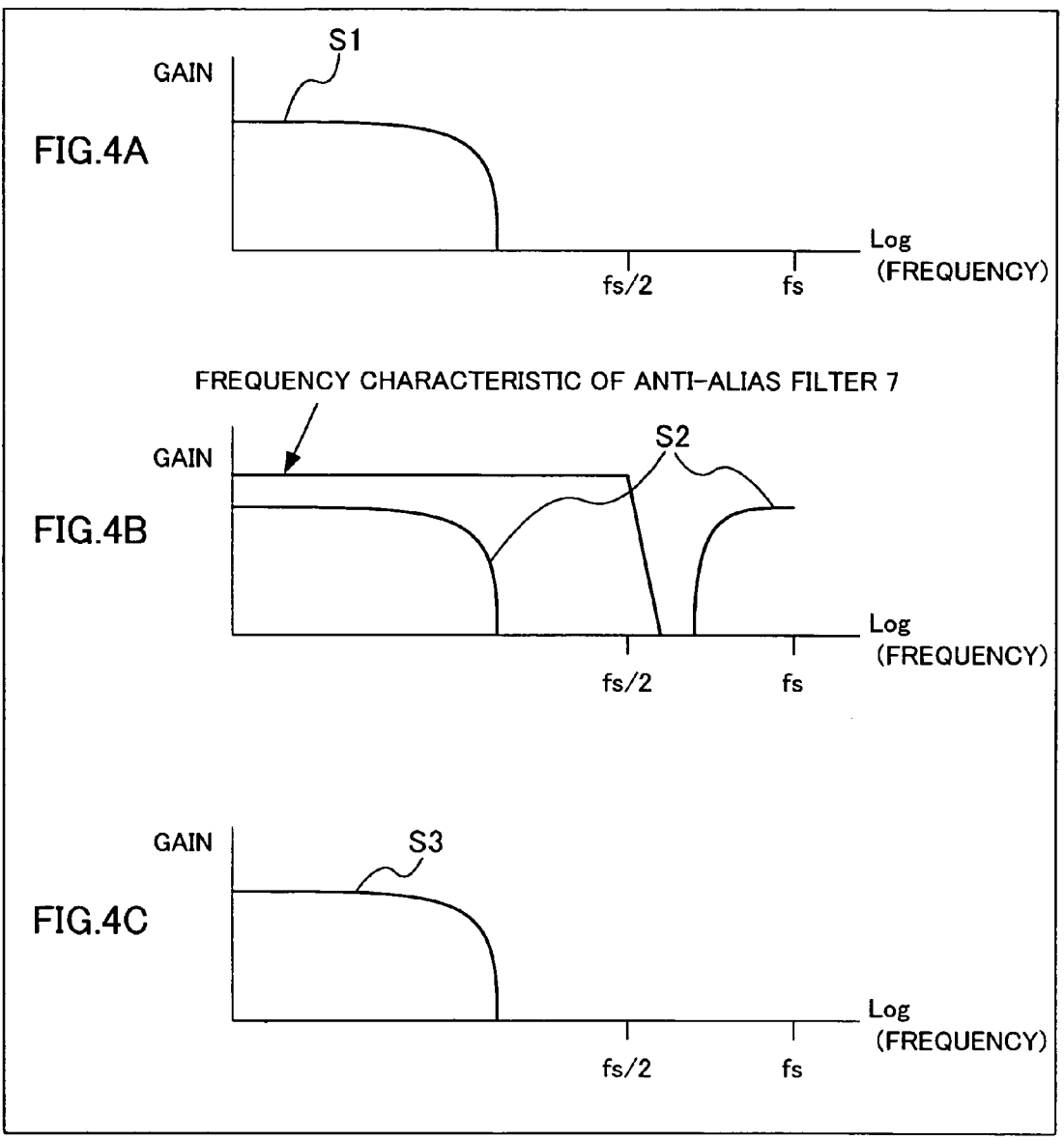
(PRIOR ART)

TWO-POINT MODULATION TYPE PHASE MODULATION APPARATUS, POLAR MODULATION TRANSMISSION APPARATUS, WIRELESS TRANSMISSION APPARATUS AND WIRELESS COMMUNICATION APPARATUS

BACKGROUND OF THE INVENTION

1. Field of the Invention

The present invention particularly relates to a two-point modulation phase modulation apparatus modulating a carrier frequency signal using an input digital baseband modulation signal by carrying out two-point modulation using a PLL (Phase Locked Loop), and a polar modulation transmission apparatus, a wireless transmission apparatus, and a wireless communication apparatus using this two-point type phase modulation apparatus.

2. Description of the Related Art

In the related art, phase modulation apparatus employing PLL's where a carrier signal is modulated by a baseband modulation signal so as to form a transmission signal (i.e. a baseband modulation signal is upconverted to a wireless frequency) are widely employed. In this type of phase modulation apparatus, low cost, low power consumption, superior noise characteristics and modulation precision are generally required. In the case of carrying out modulation using PLL's, it is desirable to make the PLL frequency band (PLL frequency band) broader than the width of the frequency band (modulation frequency band) of the modulation signal in order to give good modulation precision.

However, when PLL frequency bandwidth is made wide, this invites deterioration in noise characteristics. Technology referred to as two-point modulation where PLL frequency bandwidth is set to be narrower than modulation frequency bandwidth with modulation being applied at two different locations, modulation within the PLL frequency band and modulation outside of the PLL frequency band, has therefore been proposed (for example, refer to the specification for U.S. Pat. No. 5,952,895).

FIG. 1 shows an example configuration for two-point type phase modulation apparatus of the related art. Two-point modulation phase modulation apparatus 10 has PLL circuit comprised of a voltage controlled oscillator (VCO) 2 with an oscillation frequency changing according to a voltage of a control voltage terminal, frequency divider 3 that frequency-divides an RF phase modulation signal outputted by VCO2, phase comparator 4 that compares an output signal of frequency divider 3 and phase of a reference signal and outputs a signal according to the phase difference, and loop filter 5 that averages and outputs an output signal of phase comparator 4.

In addition to this, two-point modulation phase modulation apparatus 10 has DDS (Direct Digital Synthesizer) 1. DDS1 forms a reference signal based on inputted digital baseband modulation signal S1, and transmits this to phase comparator 4. Phase comparator 4 compares the phases of the reference signal inputted from DDS1 and frequency-dividing signal from frequency divider 3, and transmits a signal corresponding to the phase difference to loop filter 5. As a result, two-point modulation phase modulation apparatus 10 carries out modulation of the first point based on input digital baseband modulation signal S1.

Further, two-point modulation phase modulation apparatus 10 has D/A converter 6 that analog-converts input digital baseband modulation signal S1, anti-alias filter 7 that suppresses alias components contained in output signal S2 of D/A converter 6, and adder 8 that adds output signal S3 of anti-alias filter 7 and an output of PLL circuit loop filter 5 and outputs the added signal to a control voltage terminal of VCO2. As a result, two-point modulation phase modulation apparatus 10 carries out modulation of the second point based on input digital baseband modulation signal S1.

When this kind of two-point modulation technology is used, it is possible to output a wide frequency band RF phase modulation signal that goes beyond the PLL frequency band even if the PLL frequency band is set to be narrower than the modulation frequency band. As a result, it is possible to suppress deterioration of noise characteristics due to PLL.

FIG. 2 is a view showing a frequency characteristic for a baseband region for illustrating operation of the two-point modulation phase modulation apparatus. Here, a transfer function expressing the PLL frequency characteristic is taken to be H(s) (where s=j ω). H(s) has a low-pass characteristic as shown in FIG. 2. A low-pass filter of transfer function H(s) is then applied by the PLL to input digital baseband modulation signal S1 inputted to the PLL circuit via DDS1 and phase comparator 4. On the other hand, a high-pass filter of transfer function 1-H(s) as shown in FIG. 2 is applied to input digital baseband modulation signal S1 inputted to PLL circuit via D/A converter 6, anti-alias filter 7 and adder 8. Namely, when input digital baseband modulation signal S1 is taken to be Φ (s), a baseband component contained in an RF phase modulation signal outputted by voltage controlled oscillator 2 bears no relation to a PLL frequency characteristic, as shown in the following equation.

$$H(s)\Phi(s)+\{1-H(s)\}\Phi(s)=\Phi(s) \qquad (1)$$

As described above, when two-point modulation is applied to the PLL, a baseband modulation signal component mainly within the PLL frequency band is transmitted from loop filter 5 to VCO2, while baseband modulation signal component mainly outside of the PLL frequency band is transmitted from anti-alias filter 7 to VCO2. As a result, at VCO2, baseband modulation signal components for within the PLL frequency band and outside of the frequency band are added together, and it is possible to output a wide band RF phase modulation signal that goes beyond the PLL frequency band.

In addition, it is necessary for input digital baseband modulation signal S1 to be the dimension of the frequency. VCO2 acts as an integrator and an RF phase modulation signal outputted by VCO2 is therefore converted to a dimension of phase by VCO2. Here, for example, the dimension of the GSM scheme baseband modulation signal is typically phase. As a result, in reality, with baseband modulation signals such as in GSM schemes where the dimension is phase, after differentiation to give conversion to a frequency dimension, this is inputted as input digital baseband modulation signal S1 of FIG. 1.

Here, a description is given of the operation of anti-alias filter 7 using FIG. 3. The input digital baseband modulation signal S1 shown in FIG. 3A is converted to an analog signal S2 by D/A converter 6. As shown in FIG. 3B, with an analog signal S2 outputted by D/A converter 6, an alias signal that is half the frequency of the sampling frequency (fs) of D/A converter 6 wrapped around a frequency axis at a border is generated. This alias signal is then suppressed by the frequency characteristics of the anti-alias filter 7. As a result, as shown in FIG. 3C, a baseband analog modulation signal S3 without alias component is outputted from anti-alias filter 7. The horizontal axis of FIG. 3 is shown to take the Log of the frequency.

It is necessary to sufficiently suppress the alias signal in order to satisfy the specifications for noise outside of the wireless frequency band. In order to achieve this, it is therefore preferable to take large amount of attenuation of anti-alias filter 7 at the frequency of the alias signal. However, if the frequency bandwidth of anti-alias filter 7 is made too narrow in order to make the amount of suppression of the alias signal (the right side portion of the analog signal S2 of FIG. 3B) large, an original baseband modulation signal component (the left side portion of the analog signal S2 of FIG. 3B) is suppressed and modulation precision deteriorates.

Typically, it is possible to set a sampling frequency fs sufficiently high compared to the baseband modulation frequency bandwidth so as to make the generation frequency of the alias signal high. As a result, it is possible to take large amount of the attenuation of the generation frequency of the alias signal even if the frequency bandwidth of the anti-alias filter 7 is made sufficiently broader than the baseband modulation bandwidth.

However, in wireless communication in recent years, as shown in FIG. 4A, cases where a wide frequency band signal is used as baseband modulation signal S1 are common. In this case, if only the alias signal component (the right side portion of the analog signal S2 in FIG. 4B) is suppressed without suppressing the original baseband modulation signal component (the left side portion of the analog signal in FIG. 4B), as shown in FIG. 4B, an anti-alias filter 7 is required where the frequency bandwidth is broader than the frequency bandwidth of the PLL that rapidly changes the frequency characteristic between the original baseband modulation signal component and the alias signal component. Namely, a high-order anti-alias filter 7 is necessary. However, increasing the order of anti-alias filter 7 means increasing the number of dependent circuits consisting of resistors and capacitors, and the configuration of the anti-alias filter 7 therefore becomes complex.

On the other hand, as described above, a method of increasing the sampling frequency fs of the D/A converter 6 is considered as a method of suppressing only the alias signal component without increasing the order of the anti-alias filter 7 (i.e. without complicating the configuration of anti-alias filter 7). However, it is necessary to increase the clock frequency in order to increasing the sampling frequency fs of D/A converter 6 which raises another problem of the power consumption increasing as a result.

SUMMARY OF THE INVENTION

It is therefore an object of the present invention to provide two-point modulation phase modulation apparatus capable of obtaining an RF phase modulation signal with superior modulation precision that does not require an increase in sampling frequency (i.e. low power consumption) even for wide frequency band modulation and that employs an anti-alias filter of a simple configuration (i.e. low cost).

The two-point modulation phase modulation apparatus of the present invention achieves the aforementioned object by adopting a configuration provided with a PLL circuit, a differentiator that differentiates an input digital baseband modulation signal, a D/A converter that changes an output signal of the differentiator to an analog signal, an anti-alias filter that suppresses an alias component contained in an output signal of the D/A converter, and an adder that adds an output signal of the anti-alias filter and an output of a loop filter of the PLL circuit, and outputs the added signal to a control voltage terminal of a voltage controlled oscillator of the PLL circuit.

BRIEF DESCRIPTION OF THE DRAWINGS

The above and other objects and features of the invention will appear more fully hereinafter from a consideration of the following description taken in connection with the accompanying in which:

FIG. 3 is a view illustrating the operation of two-point modulation phase modulation apparatus of the related art, where FIG. 3A is a view showing a frequency characteristic of an input digital baseband modulation signal, FIG. 3B is a view showing a frequency characteristic for an alias signal and anti-alias filter, and FIG. 3C is a view showing a frequency characteristic for a baseband analog modulation signal after filtering;

FIG. 4 is a view illustrating the operation of two-point modulation phase modulation apparatus of the related art, where FIG. 4A is a view showing a frequency characteristic of a wide frequency band input digital baseband modulation signal, FIG. 4B is a view showing a frequency characteristic for an alias signal and anti-alias filter, and FIG. 4C is a view showing a frequency characteristic for a baseband analog modulation signal after filtering;

FIG. 6A is a view showing a frequency characteristic of a differentiator and a frequency characteristic of a differential signal, FIG. 6B is a view showing a frequency characteristic for an alias signal and anti-alias filter, and FIG. 6C is a view showing a frequency characteristic for a baseband analog modulation signal after filtering;

FIG. 8A is a view showing a frequency characteristic of a differentiator and a frequency characteristic of a differentiatial signal, FIG. 8B is a view showing an alias signal and a frequency characteristic of an integrator, and FIG. 8C is a view showing a frequency characteristic of a baseband analog modulation signal after integration;

FIG. 10 is a view illustrating the operation of two-point modulation phase modulation apparatus of Embodiment 3, where

DETAILED DESCRIPTION OF THE PREFERRED EMBODIMENTS

The following is a detailed description with reference to the drawings of preferred embodiments of the present invention.

(Embodiment 1)

Figure 5:
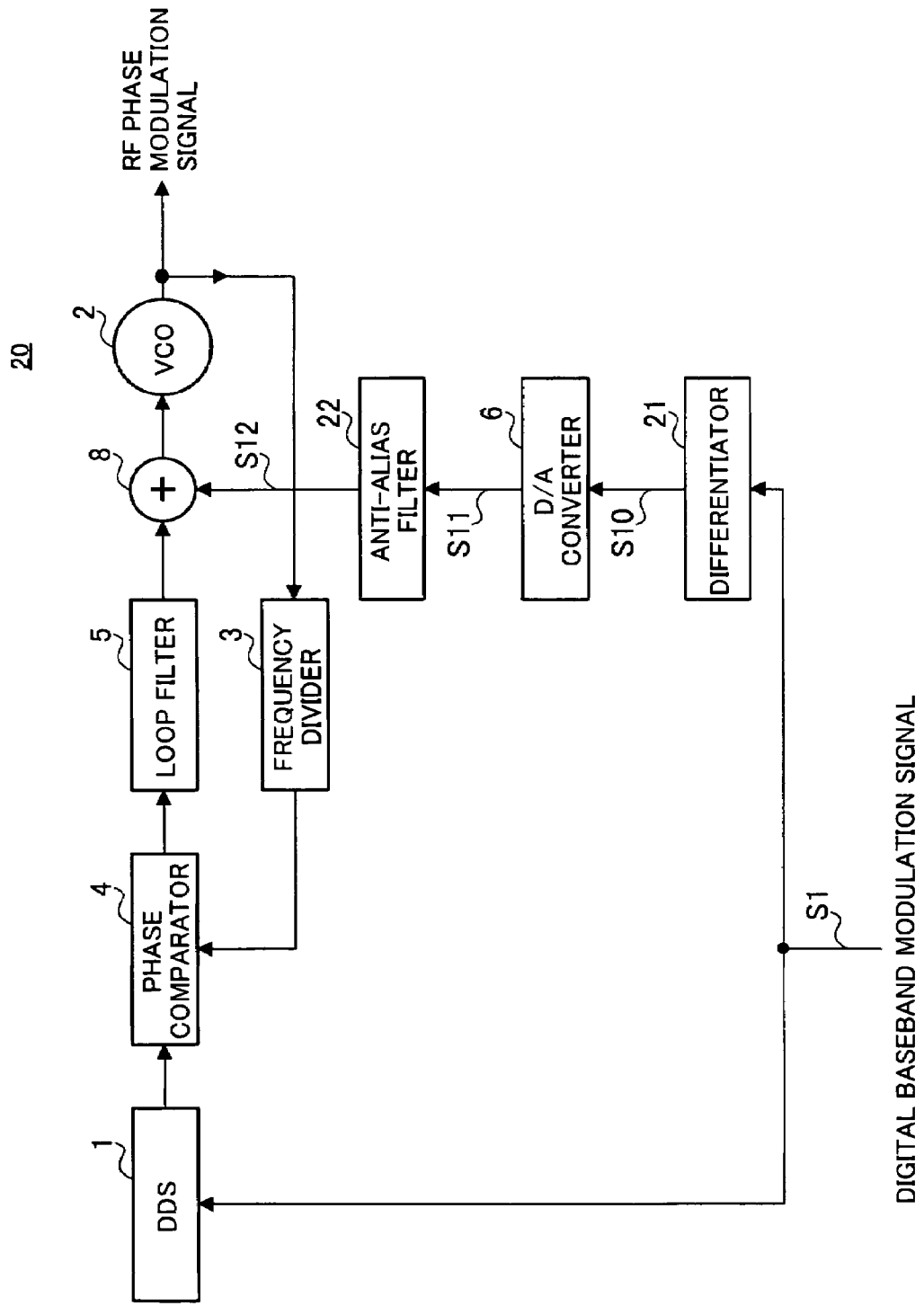
FIG. 5 is a block view showing a configuration for two-point modulation phase modulation apparatus according to Embodiment 1 of the present invention.

A configuration for two-point modulation phase modulation apparatus according to Embodiment 1 of the present invention is shown in FIG. 5. Two-point modulation phase modulation apparatus 20 has PLL circuit made up of a voltage controlled oscillator (VCO) 2 with an oscillation frequency changing according to a voltage of a control voltage terminal, frequency divider 3 that frequency-divides an RF phase modulation signal outputted by VCO2, phase comparator 4 that compares an output signal of frequency divider 3 and phase of a reference signal and outputs a signal according to the phase difference, and loop filter 5 that averages and outputs an output signal of phase comparator 4.

Further, two-point modulation phase modulation apparatus 20 has DDS (Direct Digital Synthesizer) 1. DDS1 forms a reference signal based on input digital baseband modulation signal S1 and transmits this to phase comparator 4. Phase comparator 4 compares the phases of the reference signal inputted from DDS1 and frequency-dividing signal from frequency divider 3 and outputs a signal corresponding to the phase difference. As a result, two-point modulation phase modulation apparatus 20 carries out modulation of the first point based on input digital baseband modulation signal S1.

Further, two-point modulation phase modulation apparatus 20 has a differentiator 21 that differentiates input digital baseband modulation signal S1, D/A converter 6 that converts output signal S10 of differentiator 21 to analog signal S11, anti-alias filter 22 that suppresses an alias component contained in output signal S11 of D/A converter 6, and adder 8 that adds output signal S12 of anti-alias filter 22 and an output of PLL circuit loop filter 5 and outputs the added signal to a control voltage terminal of VCO2. As a result, two-point modulation phase modulation apparatus 20 carries out modulation of the second point based on input digital baseband modulation signal S1.

Figure 1:
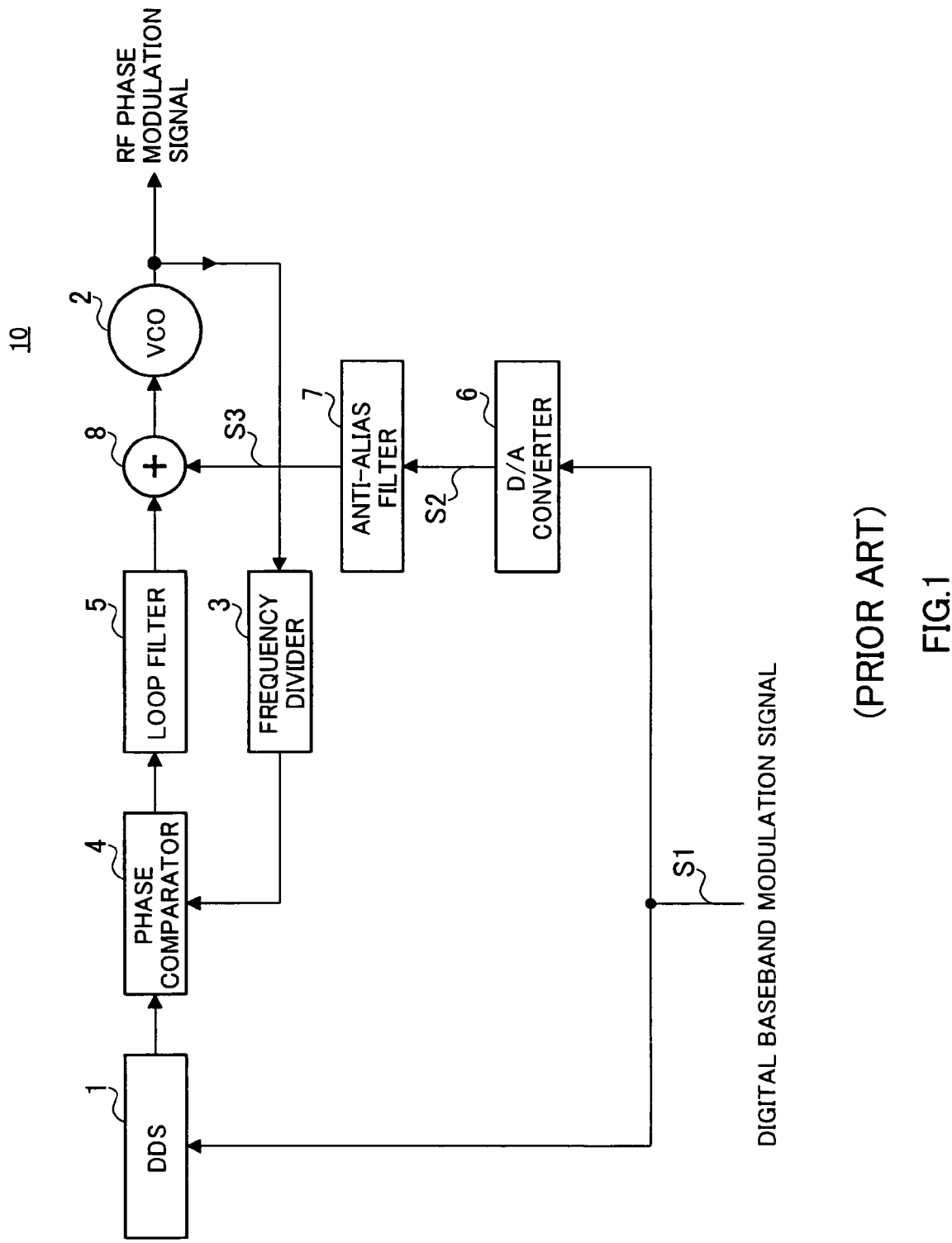
FIG. 1 is a block view showing an example configuration for two-point modulation phase modulation apparatus of the related art.
Figure 2:
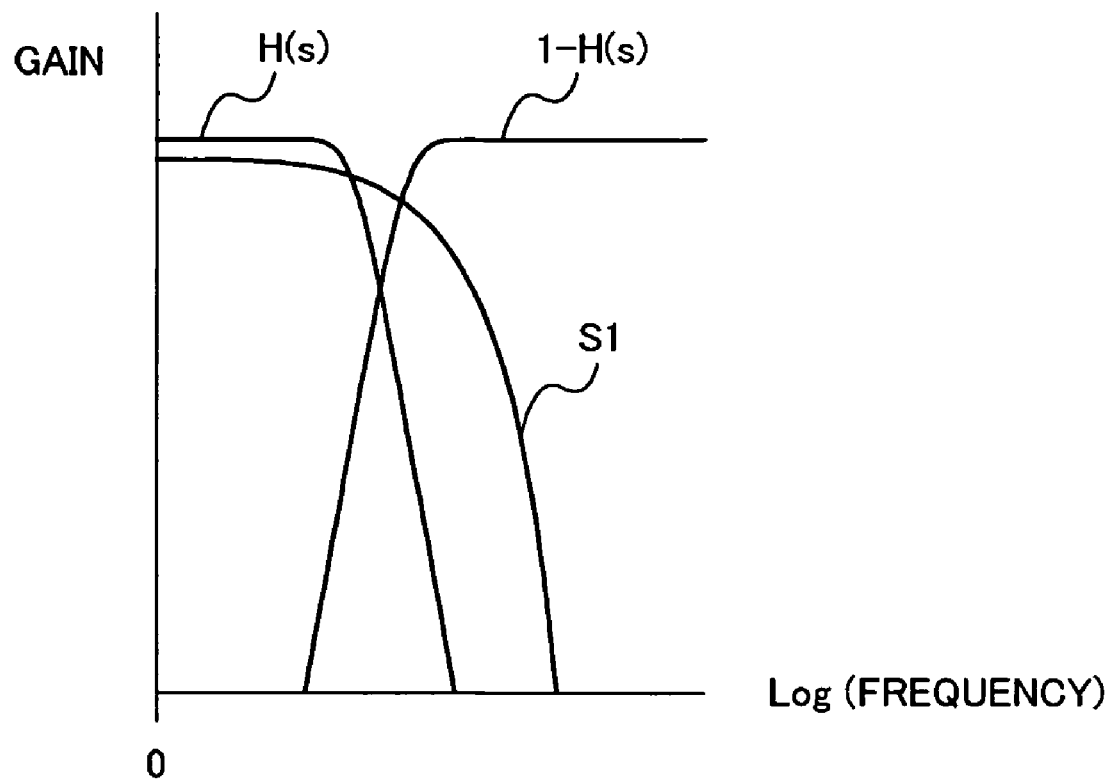
FIG. 2 is a view illustrating the operation of two-point modulation phase modulation apparatus.

Two-point modulation phase modulation apparatus 20 of this embodiment differs, compared with two-point modulation phase modulation apparatus 10 of the related art shown in FIG. 1, regarding the point that input digital baseband modulation signal S1 is inputted to D/A converter 6 after being differentiated by differentiator 21 and with regards to the point that the pass frequency bandwidth of anti-alias filter 22 is narrower than the PLL frequency bandwidth. Further, the frequency characteristic of differentiator 21 and in particular inclined portion AR1 shown in FIG. 6A is set to be the opposite characteristic to the attenuation characteristic (inclined portion AR2 of FIG. 6B) of anti-alias filter 22. As a result, the attenuation characteristic of anti-alias filter 22 is alleviated by differentiator 21, and a signal passing through both inclined portion AR1 of differentiator 21 and inclined portion AR2 of anti-alias filter 22 is maintained to give a substantially flat frequency characteristic.

Figure 6:
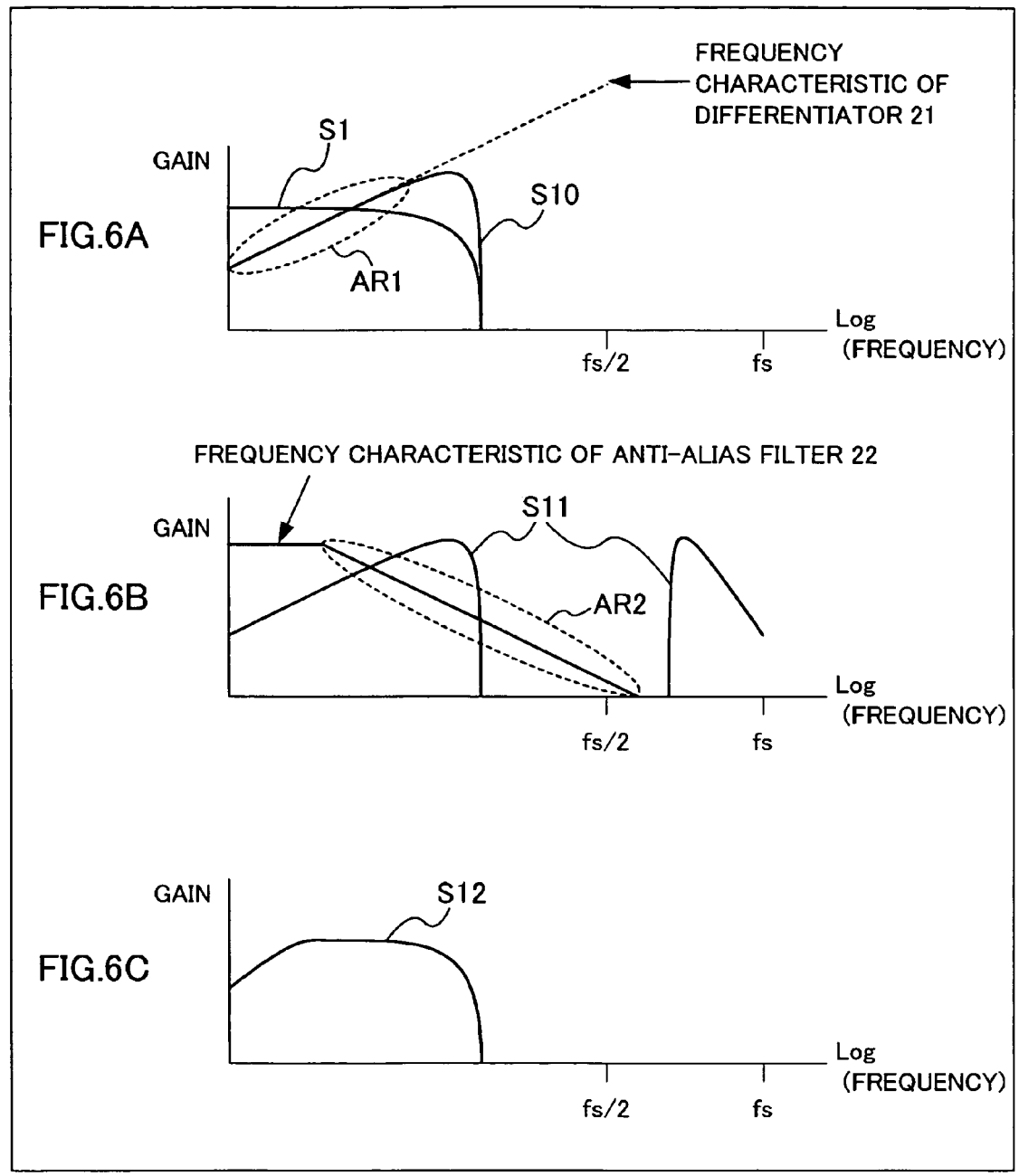
FIG. 6 is a view illustrating the operation of the two-point modulation phase modulation apparatus of Embodiment 1, where

Next, a description is given of the operation of two-point modulation phase modulation apparatus 20 of this embodiment using FIG. 6. As shown in FIG. 6A, as a result of input digital baseband modulation signal S1 passing through differentiator 21, low-frequency component is suppressed by a frequency characteristic of differentiator 21 and differential signal S10 with a high-frequency component amplified is obtained. When differential signal S10 is converted to an analog signal by D/A converter 6, as shown in FIG. 6B, an alias signal (right side portion of analog signal S11 in FIG. 6B) where a frequency of ½ of a sampling frequency (fs) of a D/A converter 6 is wrapped around the border of a frequency axis is generated. The alias signal is suppressed by anti-alias filter 22 having the narrow frequency band pass frequency characteristic shown in the same drawing, and the original baseband modulation signal component (left side portion of the analog signal S11 of FIG. 6B) is also filtered. As a result, the analog signal S12 as shown in FIG. 6C is outputted from anti-alias filter 22.

Since the pass frequency bandwidth of anti-alias filter 22 is set to be narrower than the bandwidth of PLL. Drops in the low-frequency component shown in FIG. 6C are therefore generated at the frequency region within the PLL bandwidth. From the theory of two-point modulation, baseband modulation signal component within the PLL frequency band is added at the input stage of VCO2 and the drops in the low-frequency component do not raise a substantial problem, as shown in FIG. 6C.

Further, the component in the vicinity of DC of input digital baseband modulation signal S1 is dropped by the differentiator 21 and is not returned to the original state even with the frequency characteristic of anti-alias filter 22. This is not shown in the drawings because the horizontal axis of FIG. 6 is expressed as Log. However, at the two-point modulation PLL, theoretically, a high-pass filter is applied to the modulation signal added to the control voltage terminal of VCO2, and a low-frequency component for the original baseband modulation signal is not required. From the two-point modulation theory, this is added at the input of VCO2 with the low-frequency component of the baseband modulation signal so that there is substantially no problem even if the low-frequency component is dropped as shown in FIG. 6C.

Namely, at two-point modulation phase modulation apparatus 20, even if there is loss of the low-frequency component of input digital baseband modulation signal S1 at a transmission line of differentiator 21, D/A converter 6, and anti-alias filter 22, the low-frequency component of input digital baseband modulation signal S1 remains at the transmission line of DDS1, phase comparator 4 and loop filter 5.

As a result, RF phase modulation signal outputted from VCO2 is such that the whole frequency band component of input digital baseband modulation signal S1 is reflected in a superior manner.

Therefore, by providing differentiator 21 with the inverse characteristics of the attenuation characteristics of the anti-alias filter 22 at the front stage of the D/A converter 6 to apply the characteristics of this kind of two-point modulation phase modulation apparatus, the present invention reflects the whole frequency band of input digital baseband modulation signal S1 in a superior manner and acquires an RF phase modulation signal with a superior noise characteristic without increasing the sampling frequency fs of the D/A converter 6 or increasing the order of the anti-alias filter 22. With the two-point modulation phase modulation apparatus 20 of this embodiment, compared with the two-point modulation phase modulation apparatus 10 of FIG. 1, the number of parts is increased by just differentiator 21 but this differentiator 21 may have a simple configuration such as being configured, for example, using one flip-flop circuit, which is a substantially more straightforward configuration than the case of raising the order of anti-alias filter 22.

Namely, for example, in the case of wide frequency band modulation signals such as with W-CDMA, there is substantially no influence on the quality of the wireless signal even if there is no baseband modulation signal component of 10 kHz or less. The input of VCO2, i.e. the baseband modulation signal generated by adder 8 strictly is not the same as the original baseband modulation signal at the low-frequency band but in the event of W-CDMA, if this is in the region of 10 kHz or less, there is no problem. However, additional separate mixing section to multiply an envelope component with an RF phase modulation signal is required because an envelope component is contained in the W-CDMA modulation signal.

As shown above, according to this embodiment, by providing a differentiator 21 of the inverse characteristics of the attenuation characteristics of the anti-alias filter 22 at the front stage of the D/A converter 6, even in cases of handling a wide frequency band input digital baseband modulation signal S1, it is possible to sufficiently suppress an alias signal without raising the sampling frequency of D/A converter 6 (i.e. low power consumption) using an anti-alias filter 22 of a simple configuration (i.e. low cost) with a low order for a narrower bandwidth than a PLL modulation frequency bandwidth, and it is possible to obtain an RF phase modulation signal where the entire frequency band of input digital baseband modulation signal S1 is reflected in a superior manner. It is therefore possible to implement a two-point modulation phase modulation apparatus 20 capable of obtaining an RF phase modulation signal with superior modulation precision from a wide frequency band baseband modulation signal with low power consumption and a simple configuration.

(Embodiment 2)

Figure 7:
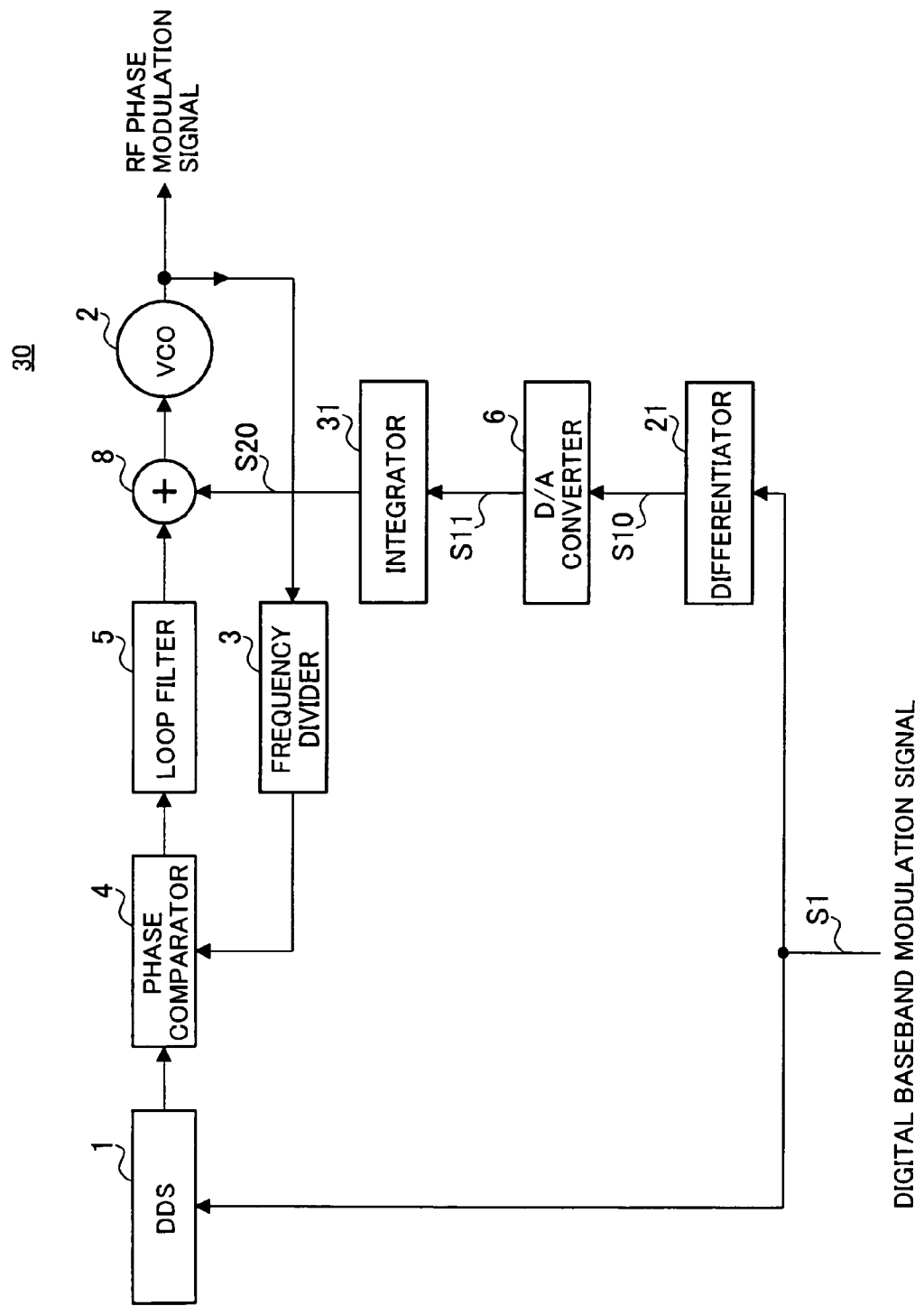
FIG. 7 is a block view showing a configuration for two-point modulation phase modulation apparatus according to Embodiment 2.

A configuration for a two-point modulation phase modulation apparatus 30 of this embodiment is shown in FIG. 7, with portions corresponding to FIG. 5 being given the same reference numerals. Two-point modulation phase modulation apparatus 30 of this embodiment differs from the two-point modulation phase modulation apparatus 20 of Embodiment 1 in that an integrator 31 is used in place of the anti-alias filter 22. It is therefore possible to obtain the same results as for Embodiment 1.

Here, the frequency characteristics of integrator 31 are set to be a narrower frequency band than the PLL modulation frequency bandwidth. The frequency characteristics (gradient) of differentiator 21 are set to be the opposite characteristics to the attenuation characteristics (gradient) of integrator 31.

Figure 8:
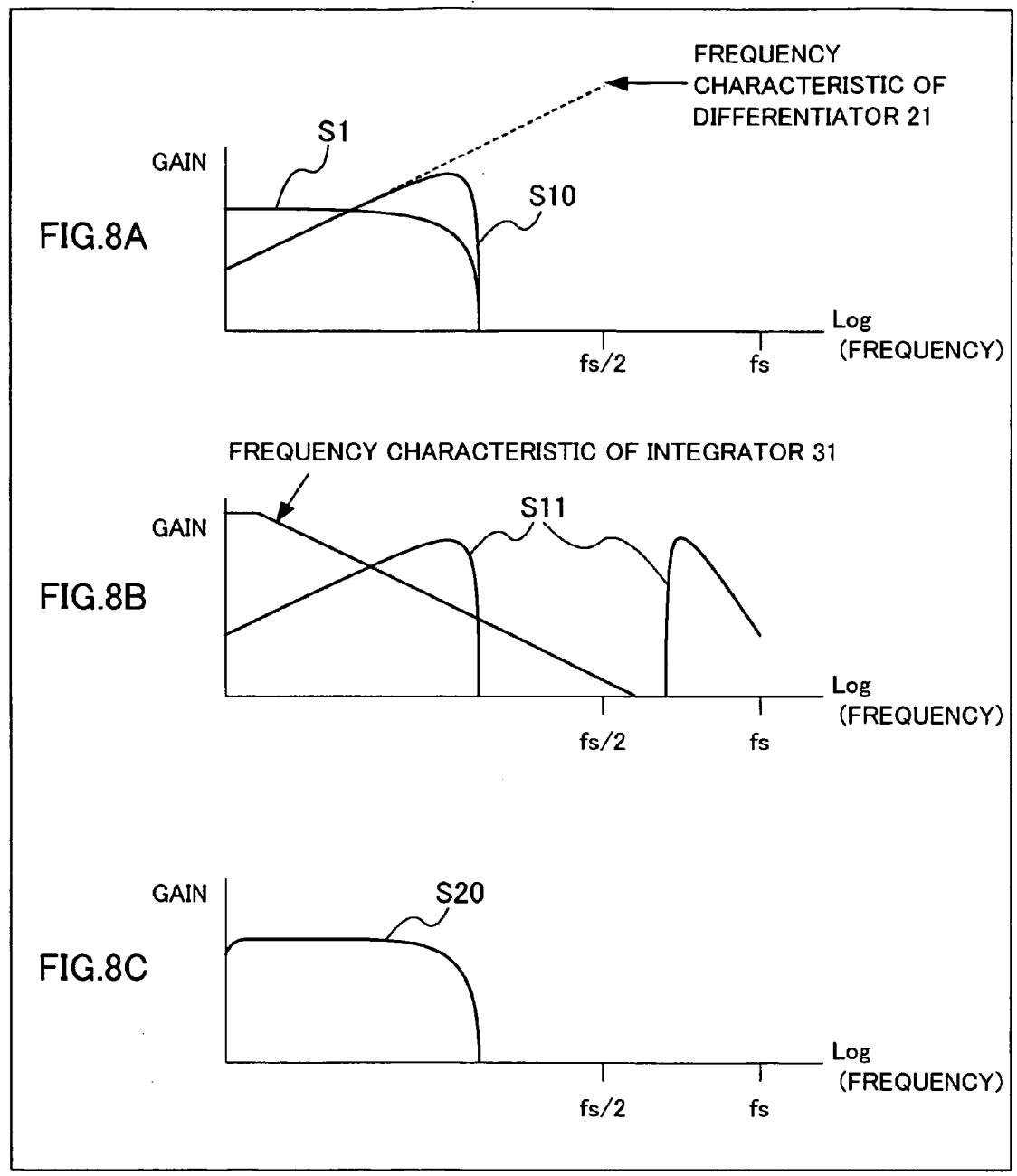
FIG. 8 is a view illustrating the operation of two-point modulation phase modulation apparatus of Embodiment 2, where

The operation of two-point modulation phase modulation apparatus 30 of this embodiment is shown in FIG. 8. Integrator 31 shown in FIG. 8B has the same frequency characteristic as anti-alias filter 22 and a signal S20 with the alias signal component removed as shown in FIG. 8C is outputted from integrator 31.

According to this embodiment, with the configuration of Embodiment 1, by configuring anti-alias filter 22 using integrator 31, it is possible to obtain an RF phase modulation signal of superior modulation precision from a wide frequency band baseband modulation signal with a low power consumption and a simple configuration so that the same advantage as for Embodiment 1 can be obtained.

(Embodiment 3)

Figure 9:
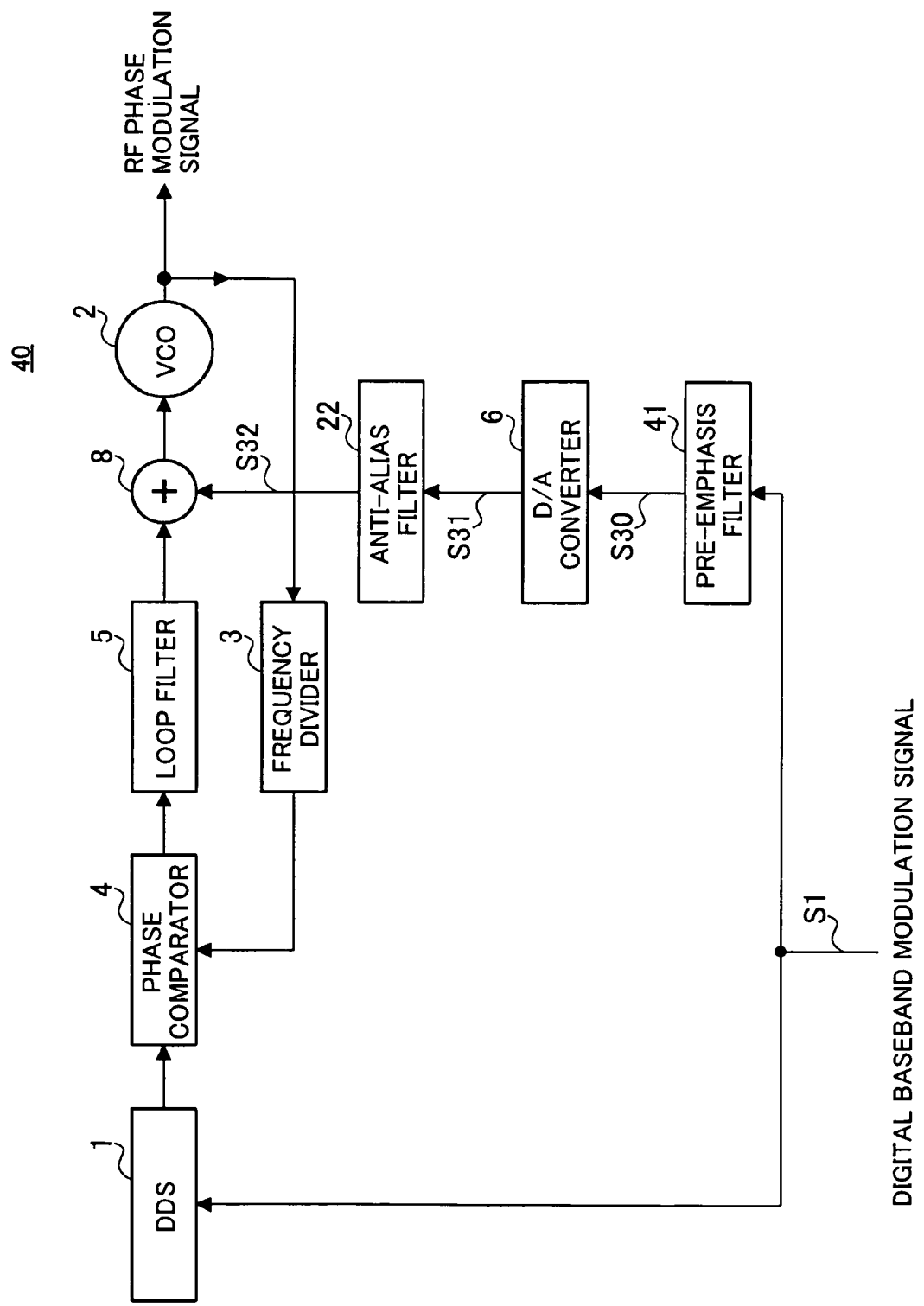
FIG. 9 is a block view showing a configuration for two-point modulation phase modulation apparatus of Embodiment 3.

A configuration for a two-point modulation phase modulation apparatus 40 of this embodiment is shown in FIG. 9, with portions corresponding to FIG. 5 being given the same reference numerals. Two-point modulation phase modulation apparatus 40 of this embodiment differs from the two-point modulation phase modulation apparatus 20 of Embodiment 1 in that a pre-emphasis filter 41 is used in place of differentiator 21.

The frequency characteristic of the pre-emphasis filter 41 is set to be the opposite characteristic of the frequency characteristic of anti-alias filter 22.

Figure 10A:
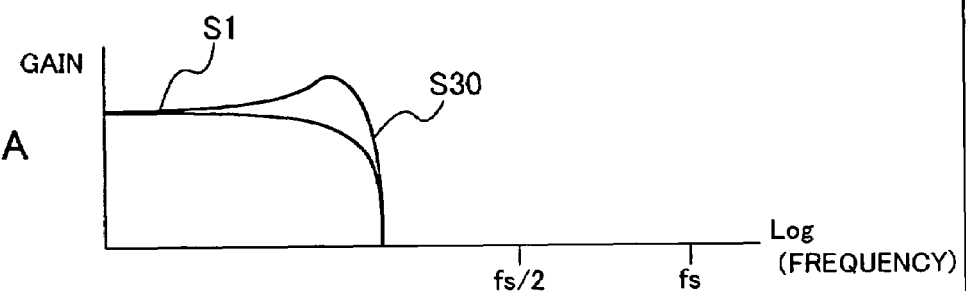
FIG. 10A is a view showing a frequency band characteristic of a wide band input digital baseband modulation signal and pre-emphasis signal.
Figure 10B:
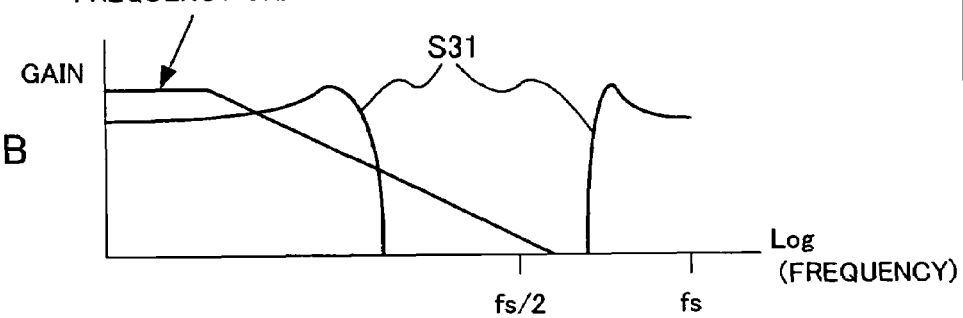
FIG. 10B is a view showing a frequency characteristic for an alias signal and anti-alias filter.
Figure 10C:
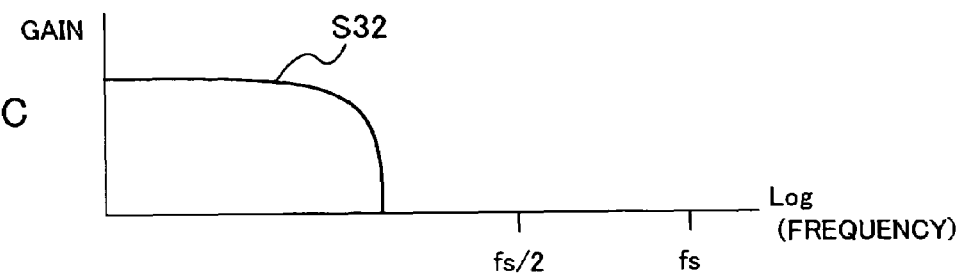
FIG. 10C is a view showing a frequency characteristic for a baseband analog modulation signal after filtering.

The operation of two-point modulation phase modulation apparatus 40 of this embodiment is shown in FIG. 10. As shown in FIG. 10A, a pre-emphasis signal S30 with a high-frequency component amplified by a frequency characteristic of pre-emphasis filter 41 is acquired as a result of passing input digital baseband modulation signal S1 through pre-emphasis filter 41. When this pre-emphasis signal S30 is converted to an analog signal by D/A converter 6, as shown in FIG. 10B, an alias signal (right side portion of analog signal S31 of FIG. 10B) is generated. This alias signal portion is suppressed by anti-alias filter 22, and an analog signal S32 as shown in FIG. 10C is outputted from anti-alias filter 22.

At two-point modulation phase modulation apparatus of this embodiment, compared to two-point modulation phase modulation apparatus 20 of Embodiment 1, as is clear from comparing FIG. 10C and FIG. 6C, there is the benefit that it is possible to acquire analog signal S32 with a low-frequency component remaining.

According to this embodiment, by providing a pre-emphasis filter 41 in place of differentiator 21 of Embodiment 1, it is possible to obtain the same advantage as for Embodiment 1. Further, it is also possible to obtain an analog signal S32 where the low-frequency component remains also for a transmission line of a pre-emphasis filter 41, D/A converter 6 and anti-alias filter 22.

(Other Embodiments)

In Embodiments 1 to 3 described above, a description is given of the case of applying the present invention to two-point modulation phase modulation apparatus of a type where DDS1 is provided and a reference signal of a phase comparator 4 of a PLL circuit is set based on input digital baseband modulation signal S1. However, the same advantage as obtained for Embodiments 1 to 3 described above can also be obtained in the case of application to a two-point modulation phase modulation apparatus where a frequency-dividing ratio of frequency divider 3 of a PLL circuit is set based on input digital baseband modulation signal S1.

Figure 11:
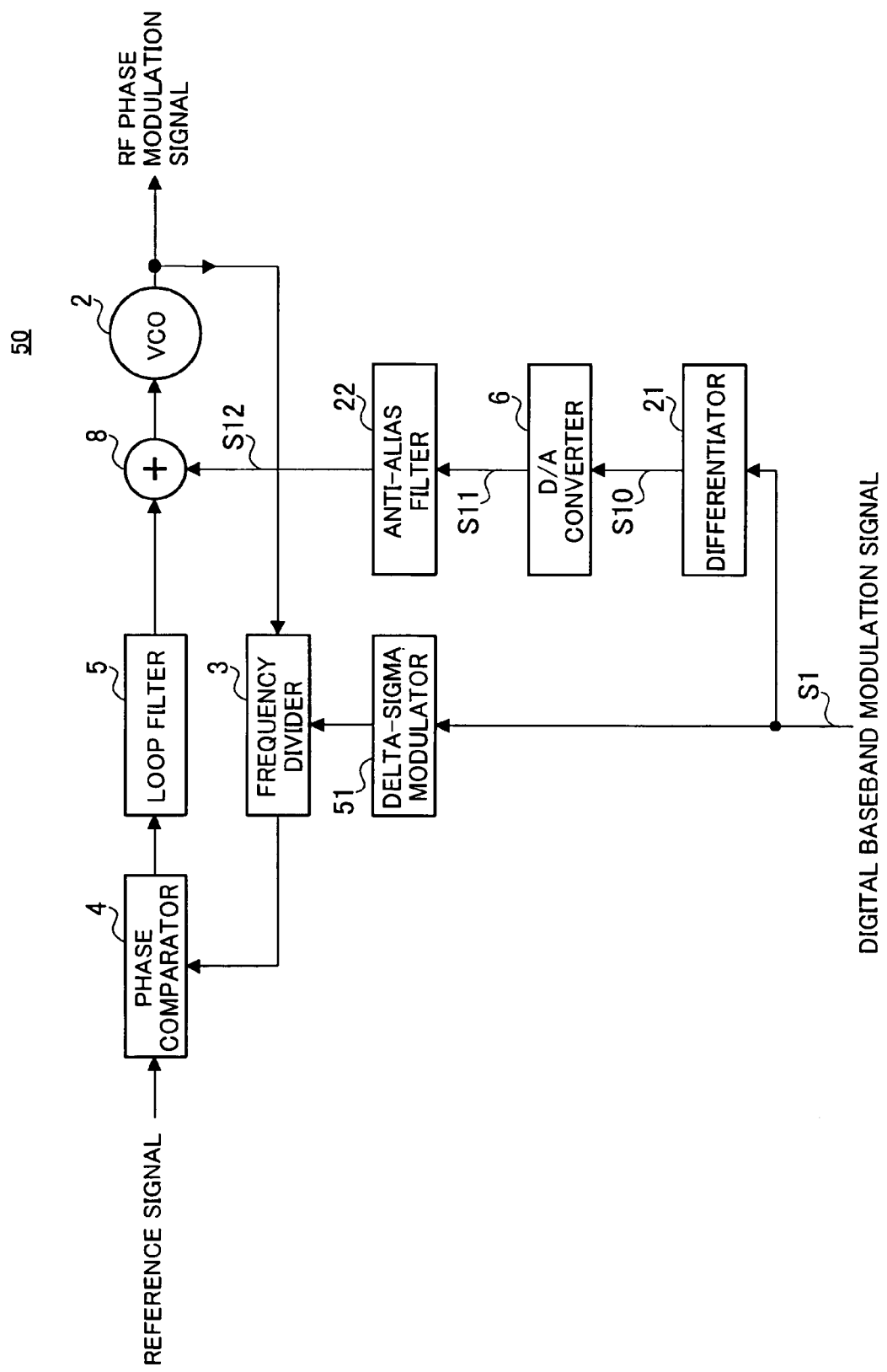
FIG. 11 is a block view showing a configuration for two-point modulation phase modulation apparatus of other embodiments.
Figure 12:
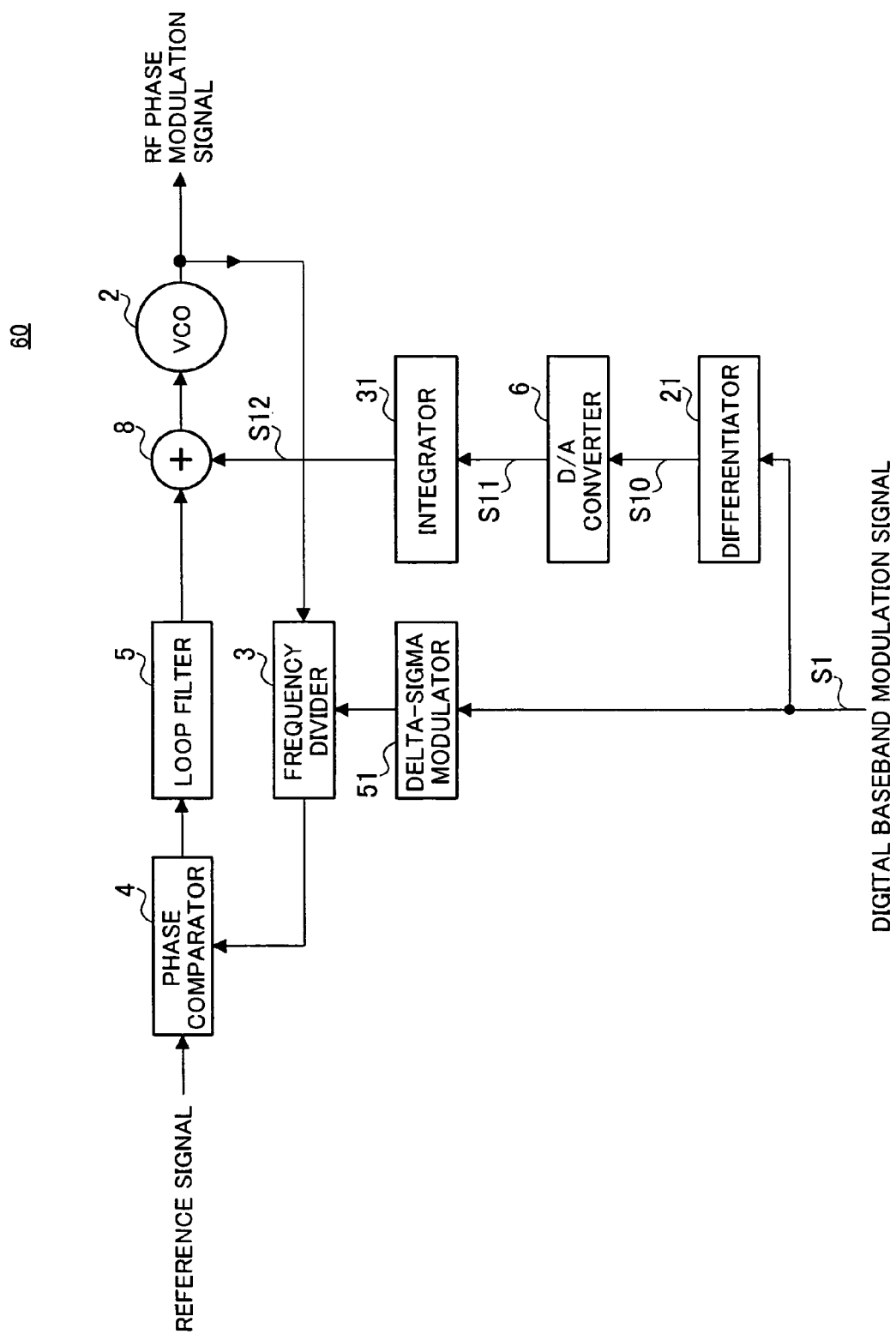
FIG. 12 is a block view showing a configuration for two-point modulation phase modulation apparatus of other embodiments.
Figure 13:
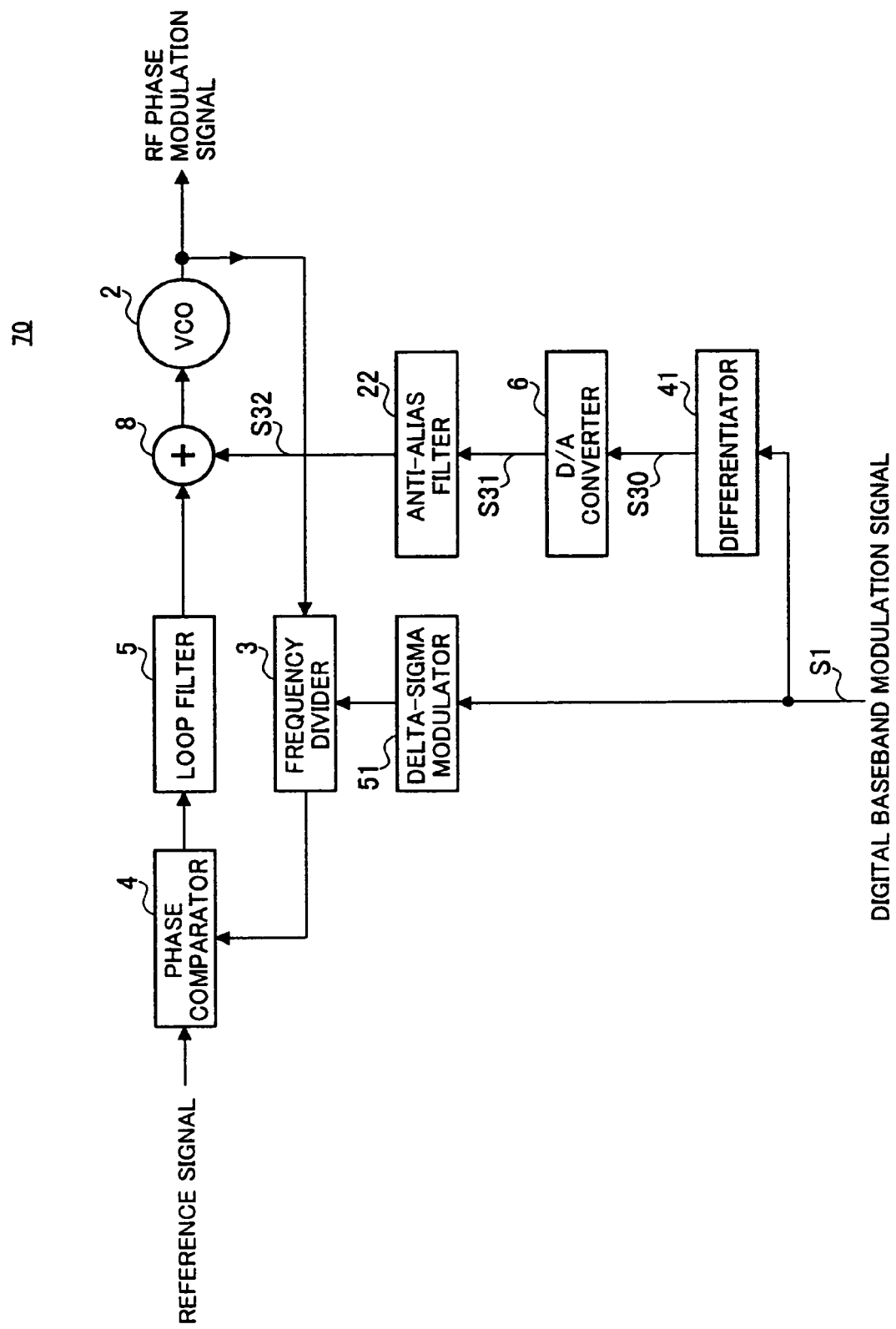
FIG. 13 is a block view showing a configuration for two-point modulation phase modulation apparatus of other embodiments.

A configuration for the case where the present invention is applied to a two-point modulation phase modulation apparatus setting a frequency-dividing ratio for frequency divider 3 of a PLL circuit based on input digital baseband modulation signal S1 is shown in FIG. 11, FIG. 12, and FIG. 13.

Two-point modulation phase modulation apparatus 50 of FIG. 11 differs from two-point modulation phase modulation apparatus 20 of Embodiment 1 in that modulation of the first point is carried out using a Delta-Sigma modulator 51 rather than DDS1. Two-point modulation phase modulation apparatus 50 Delta-Sigma modulates input digital baseband modulation signal S1 using Delta-Sigma modulator 51 and supplies the Delta-Sigma-modulated signal to frequency divider 3 as a frequency-dividing ratio. As a result, modulation of the first point is carried out. The operation for the modulation path for the second point is the same as for Embodiment 1 and the same results can be obtained.

A scheme of generating a frequency-dividing ratio changing with time by inputting a baseband modulation signal to Delta-Sigma modulator 51 and setting this at frequency divider 3 is typically referred to as a Fractional-N scheme. When this Fractional-N scheme is used, it is possible to set a comparison frequency at phase comparator 4 high compared with a scheme of modulating a reference signal using DDS and lock up time of a PLL can be made shorter accordingly. As a result, as it is possible to delay PLL start-up timing, there is another advantage capable of practically reducing power consumption.

Similarly, the difference between the two-point modulation phase modulation apparatus 60 of FIG. 12 and the two-point modulation phase modulation apparatus 30 of Embodiment 2, and the difference between the second point modulation phase modulation apparatus 70 of FIG. 13 and the two-point modulation phase modulation apparatus 40 of Embodiment 3 is that modulation of the first point is carried out using Delta-Sigma modulator 51 rather than using DDS1. The two-point modulation phase modulation apparatuses 60 and 70 of FIG. 12 and FIG. 13 also bring about the same advantage as the two-point modulation phase modulation apparatuses 30 and 40 of Embodiments 2 and 3.

(Application Example)

Figure 14:
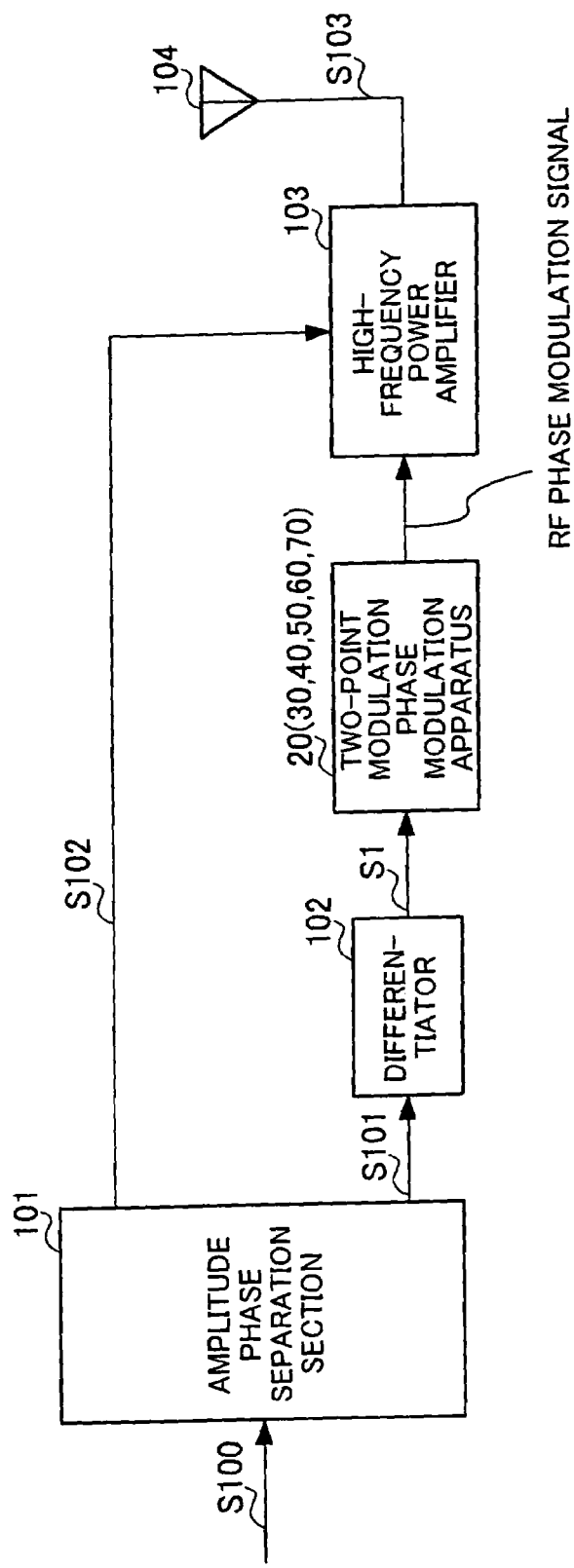
FIG. 14 is a block view showing a configuration for a polar modulation transmission apparatus to which a two-point modulation phase modulation apparatus of the present invention is applied.

A configuration for polar modulation transmission apparatus 100 to which a two-point modulation phase modulation apparatus of the present invention is applied is shown in FIG. 14. Polar modulation transmission apparatus 100 inputs baseband modulation signal S100 consisting of an I (in-phase) component and a Q (orthogonal) component to amplitude phase separation section 101. Amplitude phase separation section 101 transmits an amplitude component (i.e. $\sqrt{(I^2+Q^2)}$) of baseband modulation signal S100 to high-frequency power amplifier 103 as amplitude modulation signal S102 and sends the phase component of baseband modulation signal S100 (for example, an angle formed by a modulation symbol and an I axis) as a baseband phase modulation signal S101 to differentiator 102. Differentiator 102 converts the dimension of baseband phase modulation signal S101 to frequency. As a result, a signal corresponding to input digital baseband modulation signal S1 described in Embodiments 1 to 3 is outputted from differentiator 102.

Polar modulation transmission apparatus 100 modulates a carrier frequency signal using input digital baseband modulation signal S1 using the two-point modulation phase modulation apparatus 20 (30, 40, 50, 60 and 70) described in Embodiments 1 to 3 and other embodiments and sends an obtained RF phase modulation signal to high-frequency power amplifier 103.

High-frequency power amplifier 103 is made up of a non-linear amplifier where a power supply voltage value is set according to amplitude modulation signal S102. As a result, transmission signal S103 that is a signal where the power supply value and an RF phase modulation signal outputted from two-point modulation phase modulation apparatus 20 (30, 40, 50, 60 and 70) multiplied together amplified by just the gain of high-frequency power amplifier 103 is outputted from high-frequency power amplifier 103. Transmission signal S103 is transmitted from antenna S104.

In this way, at polar modulation transmission apparatus 100, by using the two-point modulation phase modulation apparatus 20 (30, 40, 50, 60 and 70) of Embodiments 1 to 3 and other embodiments, it is possible to acquire an RF phase modulation signal of superior modulation precision from a wide frequency band baseband modulation signal with low power consumption and a simple configuration. As a result, in the case of, for example, mounting on a mobile terminal, it is possible to implement a small mobile terminal that can be used for long time.

The two-point modulation phase modulation apparatus of the present invention is by no means limited to polar modulation transmission apparatus and may also be broadly applied to other wireless transmission apparatus and wireless communication apparatus.

Figure 15:
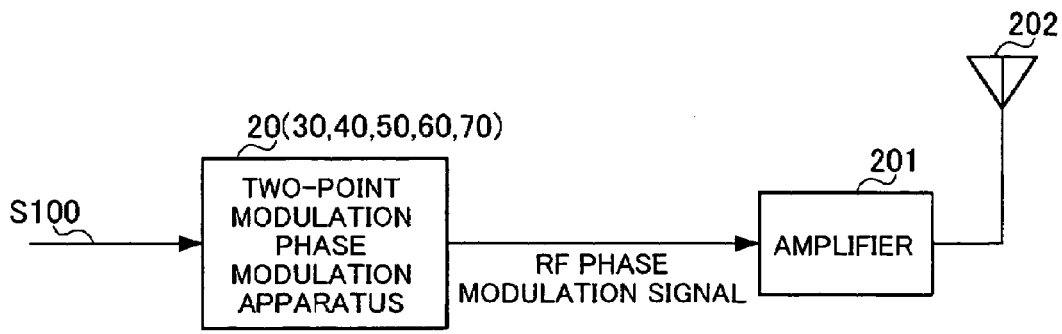
FIG. 15 is a block view showing a configuration for a wireless transmission apparatus to which a two-point modulation phase modulation apparatus of the present invention is applied.

A configuration for wireless transmission apparatus mounted with the two-point modulation phase modulation apparatus of Embodiment 1 to 3 and other embodiments is shown in FIG. 15. Wireless transmission apparatus 200 has one of the two-point modulation phase modulation apparatus 20 (30, 40, 50, 60 and 70) of Embodiment 1 to 3 or the other embodiments, amplifier 201 for amplifying an RF phase modulation signal obtained using two-point modulation phase modulation apparatus 20 (30, 40, 50, 60 and 70), and antenna 202 transmitting the amplified signal.

Figure 16:
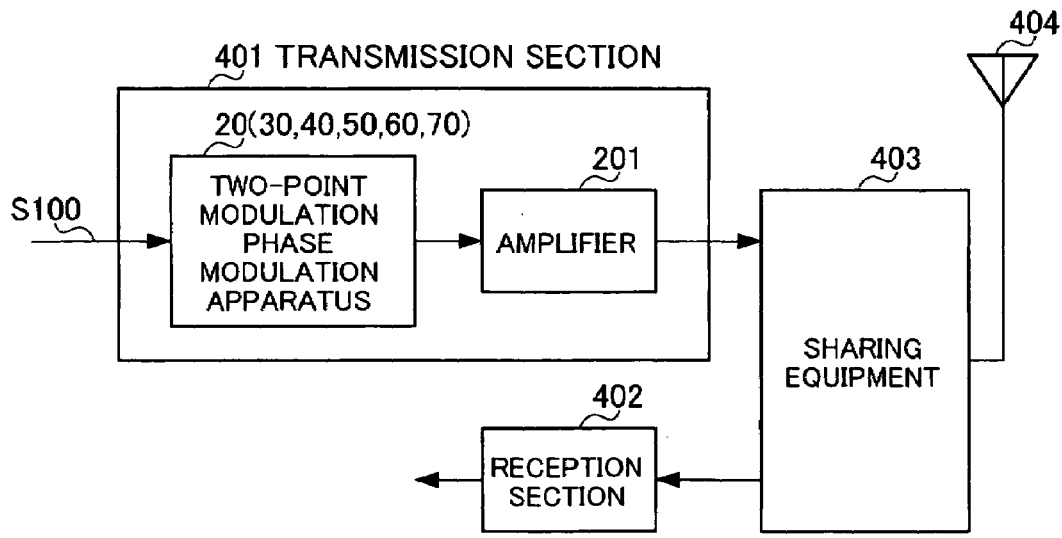
FIG. 16 is a block view showing a configuration for a wireless communication apparatus to which a two-point modulation phase modulation apparatus of the present invention is applied.

A configuration for wireless communication apparatus mounted with the two-point modulation phase modulation apparatus of Embodiment 1 to 3 and other embodiments is shown in FIG. 16. Wireless communication apparatus 300 has transmission section 401 having one of the two-point modulation phase modulation apparatus 20 (30, 40, 50, 60, 70) of Embodiments 1 to 3 or other embodiments and amplifier 201, reception section 402 subjecting the reception signal to predetermined received signal processing including demodulation processing, sharing equipment 403 switching between a reception signal and receiving signal, and an antenna 404.

As a result, at wireless transmission apparatus 200 and wireless communication apparatus 300, by mounting the two-point modulation phase modulation apparatus of the present invention, it is possible to obtain an RF phase modulation signal with superior modulation precision from a wide frequency band baseband modulation signal with low power consumption and a simple configuration. As a result, in the case of, for example, mounting wireless transmission apparatus 200 or wireless communication apparatus 300 on a mobile terminal, it is possible to implement a small mobile terminal that can be used for long time.

The present invention is not limited to the above described embodiments, and various variations and modifications may be possible without departing from the scope of the present invention.

This application is based on Japanese Patent Application No. 2005-129791 filed on Apr. 27, 2005, entire content of which is expressly incorporated by reference herein.

What is claimed is:

1. A two-point modulation phase modulation apparatus comprising:
   a phase locked loop circuit;
   a differentiator that differentiates an input digital baseband modulation signal;
   a digital/analog converter that converts an output signal of the differentiator to an analog signal;
   an anti-alias filter that suppresses an alias component contained in an output signal of the digital/analog converter; and
   an adder that adds an output signal of the anti-alias filter and an output of a loop filter of the phase locked loop circuit, and outputs the added signal to a control voltage terminal of a voltage controlled oscillator of the phase locked loop circuit, wherein
   the differentiator and the anti-alias filter have mutually opposite characteristics in a part of a frequency characteristic domain.

2. The two-point modulation phase modulation apparatus according to claim 1, wherein the anti-alias filter outputs a substantially flat signal in the part of the frequency characteristic domain where the differentiator and the anti-alias filter have mutually opposite characteristics.

3. The two-point modulation phase modulation apparatus according to claim 1, wherein the part of the frequency characteristic domain where the differentiator and the anti-alias filter have mutually opposite characteristics partly overlaps with a frequency band of the input digital baseband modulation signal.

4. The two-point modulation phase modulation apparatus according to claim 1, wherein a pass frequency bandwidth of the anti-alias filter is narrower than a frequency bandwidth of the phase locked loop circuit.

5. The two-point modulation phase modulation apparatus according to claim 1, wherein the anti-alias filter is comprised of an integrator.

6. A polar modulation transmission apparatus comprising:
   an amplitude phase separation section that forms a baseband phase modulation signal and an amplitude modulation signal based on a baseband modulation signal;
   the two-point modulation phase modulation apparatus according to claim 1 that inputs the baseband phase modulation signal as an input digital baseband modulation signal and outputs a radio frequency phase modulation signal; and
   a high-frequency power amplifier causing an amplitude of the radio frequency phase modulation signal outputted by the two-point modulation phase modulation apparatus to fluctuate according to the amplitude modulation signal.

7. A wireless transmission apparatus comprising:
   a transmission section that provides the two-point modulation phase modulation apparatus according to claim 1;
   a reception section that demodulates a reception signal; an antenna; and
   a transmission/reception switching section that switches between supplying a transmission signal from the transmission section to the antenna, and supplying a reception signal from the antenna to the reception section.

8. A two-point modulation phase modulation apparatus comprising:
   a phase locked loop circuit;
   a pre-emphasis filter that amplifies a part of a frequency band of an input digital baseband modulation signal;
   a digital/analog converter that converts an output signal of the pre-emphasis filter to an analog signal;
   an anti-alias filter that suppresses an alias component contained in an output signal of the digital/analog converter; and
   an adder that adds an output signal of the anti-alias filter and an output of a loop filter of the phase locked loop circuit, and outputs the added signal to a control voltage terminal of a voltage controlled oscillator of the phase looked loop circuit, wherein
   the pre-emphasis filter and the anti-alias filter have mutually opposite characteristics in a part of a frequency characteristic domain.

9. The two-point modulation phase modulation apparatus according to claim 8, wherein the anti-alias filter outputs a substantially flat signal in the part of the frequency characteristic domain where the pre-emphasis filter and the anti-alias filter have mutually opposite characteristics.

10. The two-point modulation phase modulation apparatus according to claim 8, wherein the part of the frequency characteristic domain where the pre-emphasis filter and the anti-alias filter have mutually opposite characteristics partly overlaps with a frequency band of the input digital baseband modulation signal.

11. A polar modulation transmission apparatus comprising:
    an amplitude phase separation section that forms a baseband phase modulation signal and an amplitude modulation signal based on a baseband modulation signal;
    the two-point modulation phase modulation apparatus according to claim 8 that inputs the baseband phase modulation signal as an input digital baseband modulation signal and outputs a radio frequency phase modulation signal; and
    a high-frequency power amplifier causing an amplitude of the radio frequency phase modulation signal outputted by the two-point modulation phase modulation apparatus to fluctuate according to the amplitude modulation signal.

12. A wireless transmission apparatus comprising:
    a transmission section that provides the two-point modulation phase modulation apparatus according to claim 8;
    a reception section that demodulates a reception signal;
    an antenna; and
    a transmission/reception switching section that switches between supplying a transmission signal from the transmission section to the antenna, and supplying a reception signal from the antenna to the reception section.

* * * * *